(12) United States Patent
Cellek et al.

(10) Patent No.: US 9,184,194 B2
(45) Date of Patent: *Nov. 10, 2015

(54) MULTIBAND PHOTODETECTOR UTILIZING SERIALLY CONNECTED UNIPOLAR AND BIPOLAR DEVICES

(71) Applicant: Arizona Board of Regents, a body corporate of the State of Arizona, acting for and on behalf of Arizona State, Scottsdale, AZ (US)

(72) Inventors: Oray Orkun Cellek, Mountain View, CA (US); Yong-Hang Zhang, Scottsdale, AZ (US)

(73) Assignee: Arizona Board of Regents, A Body Corporate of the State of Arizona, Acting for and on Behalf of Arizona State University, Scottsdale, AZ (US)

( * ) Notice: Subject to any disclaimer, the term of this patent is extended or adjusted under 35 U.S.C. 154(b) by 265 days.

This patent is subject to a terminal disclaimer.

(21) Appl. No.: 13/724,244

(22) Filed: Dec. 21, 2012

(65) Prior Publication Data

US 2013/0193308 A1 Aug. 1, 2013

Related U.S. Application Data

(60) Provisional application No. 61/578,306, filed on Dec. 21, 2011.

(51) Int. Cl.
 *H01L 27/146* (2006.01)
 *H01L 27/144* (2006.01)
 (Continued)

(52) U.S. Cl.
 CPC ........ *H01L 27/14621* (2013.01); *H01L 27/144* (2013.01); *H01L 31/02019* (2013.01); *H01L 31/105* (2013.01); *H01L 31/109* (2013.01); *H01L 31/1013* (2013.01)

(58) Field of Classification Search
 CPC . H01L 27/146; H01L 31/02162; H01L 31/09; H01L 31/1013; G01J 3/36
 USPC .......... 250/214.1, 214 R, 551, 208.1, 370.06, 250/370.08, 338.4; 327/514; 257/290–294, 257/440, 448, 184, 188
 See application file for complete search history.

(56) References Cited

U.S. PATENT DOCUMENTS 5,059,786 A 10/1991 Chu et al.
5,113,076 A 5/1992 Schulte et al.
(Continued)

OTHER PUBLICATIONS

Rolls W.H et al, "A Two-Colored Infrared Detector", Electro-optical Systems Design, vol. 9, Issue 11, pp. 10-13, 1977.
(Continued)

*Primary Examiner* — Que T Le
(74) *Attorney, Agent, or Firm* — McDonnell Boehnen Hulbert & Berghoff LLP

(57) ABSTRACT

Multi-band photodetectors can be formed by series connecting unipolar and, optionally, bipolar semiconductor structures, each having different photodetection bands. Under default mode of operation, the detector with highest resistance and lowest current will be the current limiting device and will be the active photodetector. When the active photodetector is illuminated with strong light in its own detection band it will be optically biased. This active photodetector will no longer be the highest resistance device, and the next photodetector will be the active photodetector. Repeating this operation pattern, allows switching photodetection bands of the multi-band photodetector. The resistances, dark current and photocurrent of the devices should be engineered to have proper switching. Moreover, the illuminating surface, and photodetector placement should be optimized for proper light biasing. The current passing through the device will always be equal to the current of the active photodetector.

19 Claims, 14 Drawing Sheets

(51) Int. Cl.
  H01L 31/101 (2006.01)
  H01L 31/105 (2006.01)
  H01L 31/109 (2006.01)
  H01L 31/02 (2006.01)

(56) References Cited

U.S. PATENT DOCUMENTS

| | | | |
|---|---|---|---|
| 5,149,956 | A | 9/1992 | Norton et al. |
| 5,731,621 | A | 3/1998 | Kosai et al. |
| 5,751,005 | A * | 5/1998 | Wyles et al. ............. 250/370.06 |
| 6,469,358 | B1 | 10/2002 | Martin et al. |
| 6,818,917 | B2 | 11/2004 | Kuan et al. |
| 6,875,975 | B2 | 4/2005 | Faska et al. |
| 8,143,648 | B1 | 3/2012 | Moon et al. |
| 8,350,208 | B1 | 1/2013 | Zhang et al. |
| 2012/0068050 | A1 | 3/2012 | Mazzillo et al. |

OTHER PUBLICATIONS

Campbell J.C. et al, "Dual-wavelength demultiplexing InGaAsP photodiode", Applied Physics Letters, vol. 34, Issue 6, pp. 401-402, 1979.
Sun M.J. et al, "Frequency demultiplexing in GaAsEAP waveguide detectors", Applied Optics, vol. 17, Issue 22, pp. 3533-3534, 1978.
Blazejewski E.R, et al, "Bias-switchable dual-band HgCdTe infrared photodetector", J. Vac. Science Technol. B., vol. 10, Issue 4, pp. 1626-1632, 1992.
Yoon H. et al, "Radiative Coupling Effects in GaInP/GaAs/Ge Multijunction Solar Cells", 3rd World Conference on Photovoltaic Energy Conversion, Osaka, Japan, pp. 745-748, May 11-18, 2003.
Smith E.P.G et al, "HgCdTe Focal Plane Arrays for Dual-Color Mid- and Long-Wavelength Infrared Detection", J. Electronic Materials, vol. 33, Issue 6, pp. 509-516, 2004.
Rogaliski A et al, "New material systems for third generation infrared photodetectors", Opto-Electronics Review, vol. 16, Issue 4, pp. 458-482, 2008.
Lim S.H. et al, "Analysis of Spectral Photocurrent Response from Multi-Junction Solar Cells Under Variable Voltage Bias", IEEE, pp. 712-716, 2010.
Chiu S et al, "Multi-Spectral QWIP-LED Devices: A Feasibility Study", Defense Research Establishment Ottawa Technical Memorandum, Oct. 1999.
Rogaliski A et al, "Optical detectors for focal plane arrays", Opto-Electronics Review, vol. 12, Issue 2, pp. 221-245, 2004.
Zhang et al, Proceedings of the 33rd IEEE Photovoltaic Specialists Conference, pp. 30, 2008.
Meusel M et al, "Spectral response measurements of monolithic GaInP/Ga(In)As/Ge Triple-Junction Solar Cells: Measurements Artifacts and their Explanation", Progress in Photovoltaics: Research and Applications. vol. 11, pp. 499-514, 2003.
Baur C.H. et al, "Effects of optical coupling in III-V multilayer systems", Applied Physics Letters, vol. 90, Issue 19, pp. 192109, 2007.
O.O. Cellek, Y.-H. Zhang, "Optically addressed multiband photodetector for infrared imaging applications", Proc. SPIE vol. 8268, p. 8268N, 2012.
O.O. Cellek, H.S. Kim, J.L. Reno, Y.-H. Zhang, "NIR/LWIR dual-band infrared photodetector with optical addressing ", Proc. SPIE, 8353, p. 83533E, 2012.
O.O. Cellek, J.L. Reno, Y.-H. Zhang, "Optically-addressed near and long-wave infrared multiband photodetectors", Appl.Phys. Lett.,vol. 100, p. 241103, 2012.
Majumdar A et al, "Voltage tunable two-color infrared detection using semiconductor superlattices", Applied Physics Letters, vol. 83, Issue 25, pp. 5130-5132, 2003.

Tidrow M.Z. et al, "Voltage tunable three-color quantum well infrared photodetector" Applied Physics Letters, vol. 64, Issue 10, pp. 1268-1270, 1994.
Hoffman A.W. et al, "Megapixel detector arrays: visible to 28 um", Proc. SPIE, 5167, pp. 194, 2004.
Badara S.V. et al, "Monolithically Integrated near-infrared and mid-infrared detector array for spectral imaging", Infrared Phys. Technol., vol. 50, Issue 2-3, pp. 211-216, 2007.
Martin T. et al, "640x512 InGaAs focal plane array camera for visible and SWIR imaging", Proc SPIE, vol. 5783, pp. 12-20, 2005.
Gunapala S.D. et al. "Dependence of performance of GaAs/AlGaAs quantum well infrared photodetectors on doping and bias", J. Appl. Phys., vol. 69, Issue 9, pp. 6517-6520, 1991.
Beck W.A. et al, "Photoconductive gain and generation-recombination noise in multiple-quantum well infrared detectors", Applied Physics Letters, vol. 63, Issue 26, pp. 3589-3591, 1993.
Abbott P.L. et al, "Advances in dual-band IR FPAs made from HgCdTe grown by MOVPE", Proc SPIE, vol. 7660, pp. 766035, 2010.
Smith E.P.G. et al, "HgCdTe Focal Plane Arrays for Dual-Color Mid- and Long-Wavelength Infrared Detection". J. Electron Mater, vol. 33, Issue 6, pp. 509, 2004.
Khoshakhlagh A. et al, "Bias dependent dual band response from InAs/Ga(In)Sb type II strain layer superlattice detectors", Applied Physics Letters, vol. 91, pp. 263504, 2007.
Huang E.K. "Type-II superlattice dual-band LWIR imager with M-barrier and Fabry-Perot resonance", Opt. Lett., vol. 36, pp. 2560-2562, 2011.
Sundaram M. et al, "Two-color quantum well infrared photodetector focal plane arrays", Infrared Phys. Technol., vol. 42, Issue 3-5, pp. 301-308, 2001.
Gunapala S.D. et al. "Demonstration of Megapixel Dual-Band QWIP Focal Plane Array", IEEE J. Quantum Electron., vol. 46, Issue 2, pp. 285-293, 2010.
Majumdar A. et al, "Voltage tunable superlattice infrared photodetector for midand long-wavelength detection" Applied Physics Letters, vol. 86, Issue 26, pp. 261110, 2005.
Eker S.U. et al, "Large-format voltage-tunable dual-band quantum-well infrared photodetector focal plane array for third-generation thermal imagers", IEEE Electron Device Lett., vol. 29, Issue 10, pp. 1121-1123, 2008.
Tidrow M.Z. et al, "A four-color quantum well infrared photodetector", Applied Physics Letters, vol. 74, Issue 9, pp. 1335-1337, 1999.
Cohen N. et al, "Integrated HBT/QWIP structure for dual color imaging", Infrared Phys. Technol., vol. 47, Issue 1-2, pp. 43-52, 2005.
Krishna S. et al, "Demonstration of 320x256 two-color focal plane array using InAs/InGaAs quantum dots in well detectors", Applied Physics Letters, vol. 86, Issue 9, pp. 193501, 2005.
Liu H.C. et al, "Multicolor voltage-tunable quantum-well infrared photodetector", IEEE Electron Dev. Let., vol. 14, Issue 12, pp. 566-568, 1993.
Lenchyshyn L.C. et al, "Voltage-tuning in multi-color quantum well infrared photodetector stacks", J. Appl. Phys., vol. 79, Issue 10, pp. 8091-8097, 1996.
Bezinger a. et al, "Dual spectral InGaAs/InP quantum-well infrared photodetector focal plane array", Electron Lett., vol. 43, Issue 12, pp. 685-686, 2007.
Cho E. et al, "Development of visible-NIR/LWIR QWIP sensor", Proc. SPIE, 5074, pp. 735-743, 2003.
Steenbergen E.H. et al, "Optically-addressed two-terminal multicolor photodetector", Applied Physics Letters, vol. 97, Issue 16, pp. 161111, 2010.
Steenbergen E.H. et al, "Effects of varying light-bias on an optically-addressed two-terminal multicolor photodetector", Infrared Phys. Technol., vol. 54, Issue 3, pp. 292-295, 2011.

* cited by examiner

| |
|---|
| AlGaAs/GaAs PIN Photodetector (NIR) |
| AlGaAs/GaAs QWIP Photodetector (LWIR) |
| GaAs Substrate |

Figure 5

| |
|---|
| InP Heterojunction Phototransistor (NIR) |
| InGaAs PIN Photodetector (SWIR) |
| AlInAs/InGaAs QWIP (MWIR) |
| InP/InGaAs QWIP (LWIR) |
| InP Substrate |

Figure 6

| |
|---|
| ZnTe PIN Photodetector (UV) |
| GaSb PIN Photodetector (SWIR) |
| InAs/InAsSb SL nBn (MWIR) |
| InAs/InAsSb SL nBn (LWIR) |
| GaSb Substrate |

Figure 7

MULTIBAND PHOTODETECTOR UTILIZING SERIALLY CONNECTED UNIPOLAR AND BIPOLAR DEVICES

CROSS-REFERENCE TO RELATED APPLICATIONS

This application claims the benefit of priority to U.S. Provisional Patent Application Ser. No. 61/578,306, filed on Dec. 21, 2011, which is incorporated by reference in its entirety.

STATEMENT REGARDING FEDERALLY SPONSORED RESEARCH

This invention was supported in part with funding provided by Air Force Office of Scientific Research (AFOSR Grant No. FA9550-10-1-0129). The United States government has certain rights to this invention.

FIELD OF THE INVENTION

The disclosure generally provides utilizing unipolar and, optionally, bipolar devices for multi band photodetection, imaging, remote sensing and communications.

BACKGROUND OF THE INVENTION

State of the art multi-band photodetectors for imaging, remote sensing or communications applications either use voltage polarity switching, or more than one electrical connection per pixel, or spatially separated detectors where each photodetector active volume is detecting different spectral band. Making small pixel pitch 3-band and more band detectors demand more complex electrical switching and electrical connections. This also makes dense, small pitch focal plane array (FPA) fabrication challenging. Related invention on multi-color photodetectors and focal plane arrays utilizing optical addressing describes a method to use extra optical illumination to switch detection bands (See U.S. Ser. No. 13/011,475, supra). This approach demands one optical source to each optical band and demands complicated tunnel junctions to isolate each bipolar photodetector from each other.

SUMMARY OF THE INVENTION

An innovative approach is provided that utilizes unipolar and, optionally, bipolar devices for multi-band photodetectors. The design can use unipolar photodetectors series connected with bipolar photodetectors, and can take advantage of contrast of impedances to reduce the number of optical biasing light sources. It also utilizes advantages of unipolar devices to eliminate tunnel junctions between any of the photodetectors. The described methods can provide for simpler multi-band detector fabrication and operation.

In one aspect, photodetector modules are provided comprising, (i) one or an array of multi-band photodetector units (MBPD), wherein each individual MBPD comprises (a) a first building block having a first photodetection band; (b) an ultimate building block, having a second photodetection band positioned over or under the first building block; wherein the building blocks are serially connected, and the first and second photodetection bands are not identical; and wherein the first building block or ultimate building block comprises a detecting surface; (ii) one or more light sources, wherein one light source has a first light spectrum that can be absorbed by the first building block; wherein each light source is positioned to illuminate the detecting surface of the MBPDs.

In another aspect, methods are provided for collecting an optical signal comprising illuminating the detecting surface of a photodetector module of the preceding aspect with one or more light sources to optically bias all except for one of the building blocks within each of the individual MBPDs; exposing the detecting surface to an optical signal to generate a photodetector response; and collecting the photodetector response.

BRIEF DESCRIPTION OF THE DRAWINGS

FIG. 5 is schematic layer structure of an exemplary two-band MBPD where PIN photodetector and QWIP photodetector are used as an example on GaAs substrate.

FIG. 6 is a schematic diagram of an exemplary four-band MBPD on InP substrate.

FIG. 7 is a schematic diagram of an exemplary four-band MBPD on GaSb substrate.

DETAILED DESCRIPTION OF THE INVENTION

Figure 1:
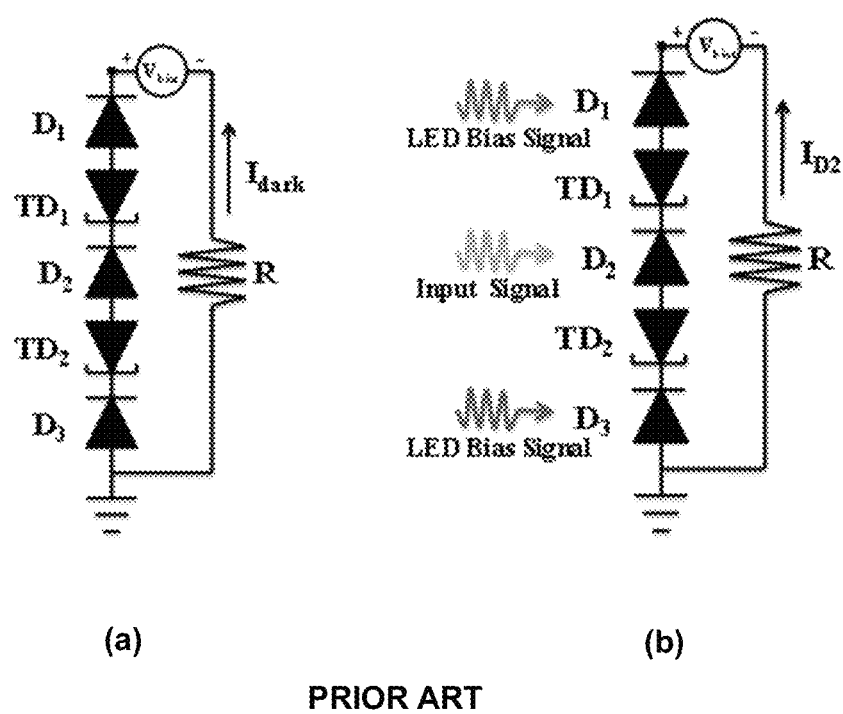
FIG. 1 shows (a) three different wavelength photodetectors, $D_1$, $D_2$ and $D_3$ for three different detection bands; (b) photodiodes $D_1$ and $D_3$ are optically biased and operates in photovoltaic mode. The total current flowing through the circuit is limited by $D_2$ and $D_2$ is able to detect the optical signal changes that lie in the active spectral band.
Figure 2A:
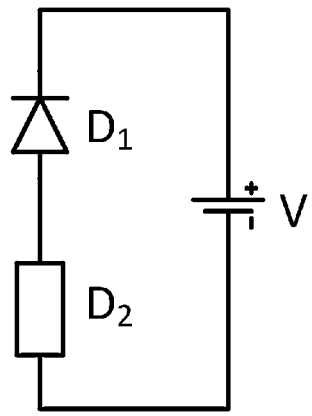
FIG. 2a shows two different wavelength photodetectors, $D_1$ and $D_2$, where $D_1$ is bipolar and $D_2$ is a unipolar device.
Figure 2B:
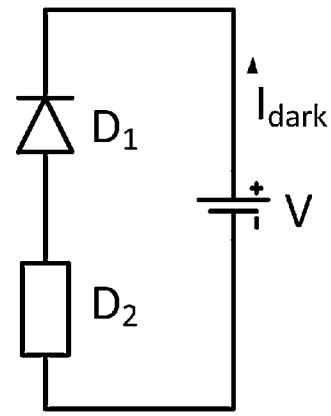
FIG. 2b is a circuit diagram of a detection unit (MBPD) connected with an external bias; the MBPD is in the dark without any optical bias applied to the photodetectors.

Herein, an approach is provided to enable two-terminal multiband photodetectors (MBPDs) and FPAs for multi-band (>1) detection or imaging. As shown in FIG. 2a, each MBPD consists of multiple photodetectors ($D_1$-$D_2$) with different bandgaps, or cutoff wavelengths, or peak wavelengths, connected in series without requiring tunnel junctions. Under external reverse bias (V), the total dark current ($I_{dark}$) going through such a MBPD is dictated by the smallest current of all of the photodetectors D1 and D2, which typically will be that of the D1 photodiode with the largest bandgap (see FIG. 2b).

Figure 2C:
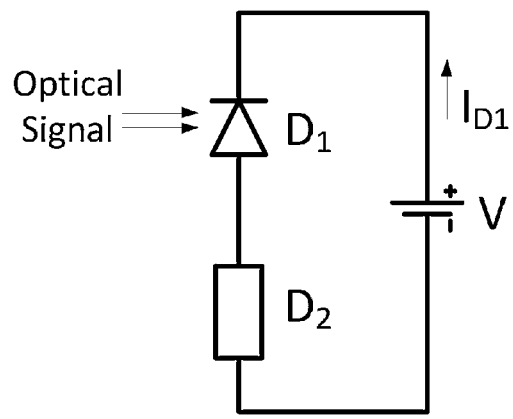
FIG. 2c shows a circuit diagram of a MBPD illuminated by optical signal light; the total photogenerated current of the MBPD is dictated by the bipolar photodetector ($D_1$) current in the MBPD, as long as it is smaller than the current unipolar photodetector ($D_2$), which typically has higher dark current than that of $D_1$.

As shown in FIG. 2c, when an optical signal is incident on MBPD, the photocurrent is measured through series connected $D_1$ and $D_2$ (building block). Typically, the background current corresponding to $D_2$ is higher than the background current and the photocurrent of $D_1$, hence the measured current passing through the MBPD is dictated by $D_1$.

Figure 2D:
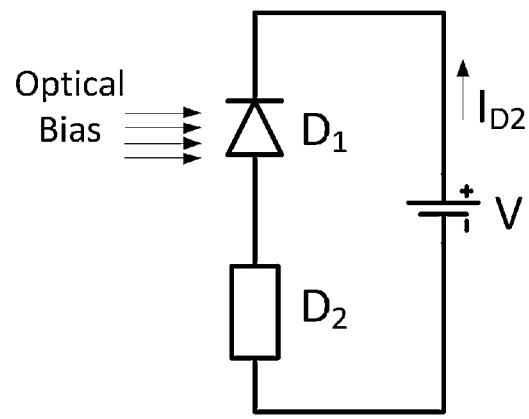
FIG. 2d shows a circuit diagram of a MBPD illuminated by optical bias light; the total photogenerated current of the MBPD is dictated by the detecting photodetector's ($D_2$) current in the MBPD, as long as it is smaller than the photogenerated current of the optically biased photodetector $D_1$, which operates in the photovoltaic (PV) mode when $V_{Bias} \leq 0$ V.

As shown in FIG. 2d, when a light source (e.g., LED or laser diode or broadband lamp with or without filter) with wavelengths corresponding to $D_1$ (building block) in a MBPD is used to optically bias the $D_1$, the entire MBPD operates as one single-color detector with a spectral response determined by the $D_2$. Typically the current corresponding to optical flux on $D_2$, where this flux must lie in the responsivity window of $D_2$, is smaller than the reverse saturation current of photodetector $D_1$.

Figure 3:
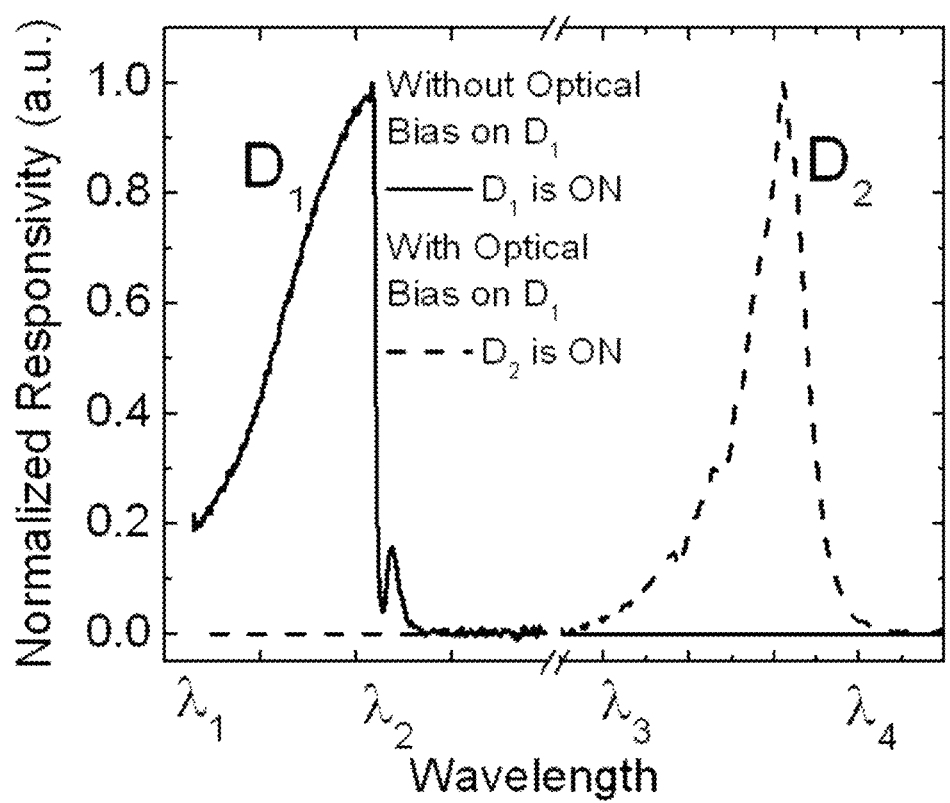
FIG. 3 is a schematic diagram of responsitivities of the two photodetectors in a typical operation with optical bias on $D_1$.

FIG. 3 shows a schematic illustration of the detector responsivity under different LED biases. Under optical bias on $D_1$, the photodetector $D_1$ work in the photovoltaic (PV) mode, and the total current is dictated by the $D_2$, as long as it is smaller than the reverse current of the $D_1$.

Accordingly, in one embodiment are provided photodetector modules comprising, (i) one or an array of multi-band photodetector units (MBPD), where each MBPD comprises at least two photodetectors, where each photodectector is independently a unipolar or a bipolar photodectector, provided that at least one photodectector is a unipolar photodectector and all photodetectors are connected in series. For example, each individual MBPD can comprise (a) a first building block having a first photodetection band; (b) an ultimate building block, having a second photodetection band positioned over or under the first building block; wherein the building blocks are serially connected, and the first and second photodetection bands are not identical; and wherein the first building block or ultimate building block comprises a detecting surface; (ii) one or more light sources, wherein one light source has a first light spectrum that can be mostly absorbed by the first building block; wherein each light source is positioned to illuminate the detecting surface of the MBPDs. The term "mostly absorbed" as used herein means that a light spectrum is absorbed very effectively by the first building block. Very little light will go through it and reach the second. Block underneath the first one.

Another embodiment provides a photodetector modules comprising, (i) one or an array of multi-band photodetector units (MBPD), where each MBPD comprises at least two photodetectors, where each photodectector is independently a unipolar or a bipolar photodectector, provided that at least one photodetector is a unipolar photodetector and all photodetectors are connected in series. For example, each individual MBPD can comprise (a) a first building block having a first photodetection band; (b) an ultimate building block, having a second photodetection band positioned over or under the first building block; wherein the building blocks are serially connected, and the first and second photodetection bands are not identical; and wherein the first building block or ultimate building block comprises a detecting surface; (ii) one or more light sources, wherein one light source has a first light spectrum that can be substantially absorbed by the first building block; wherein each light source is positioned to illuminate the detecting surface of the MBPDs. The term "substantially absorbed" as used herein means that a light spectrum is absorbed with a quantum efficiency that gives a signal to noise ratio greater than one.

In certain embodiments, the module comprises a second light source having a second light spectrum that can be absorbed by the ultimate building block. In other embodiments, the first light spectrum can be absorbed only by the first building block. In other embodiments, the second light spectrum can be absorbed only by the ultimate building block.

The array of multi-band photodetectors (MBPDs) can generally be arranged in a predetermined arrangement. In one embodiment, the array is a two-dimensional array. In another embodiment, the array is a linear array. When arranged in an array, each individual MBPD comprises two contacts; one of which is a discrete contact for each individual MBPD while the other is a common contact for the entire array.

In an embodiment of any of the preceding embodiments, each individual MBPD can comprise a semiconducting substrate, wherein the first building block is positioned over, or directly over, the semiconducting substrate. The semiconducting substrate can be any such substrate suitable for the intended purpose. In one embodiment, the semiconducting substrate is an III-V semiconductor substrate or a virtual substrate consisting of an epitaxial III-V semiconductor layer grown on another substrate made of other semiconductors, such as a ZnTe or GaSb epitaxial layer on a Si or Ge substrate. Examples of III-V substrates include, but are not limited to, a substrate comprising, consisting essentially of, or consisting of GaN, GaAs, GaSb, InAs, InSb, InP, ZnTe, or CdTe. Semiconducting substrates comprising an epitaxial III-V semiconductor layer on another substrate include, but are not limited to epitaxial GaAs, GaSb, InAs, InSb, or InP layers on a Si or Ge substrate, where the Si or Ge substrate can be intrinsic, or n- or p-doped.

In another embodiment, the semiconducting substrate is an II-VI semiconductor substrate or an epitaxial II-VI semiconductor layer grown on another substrate, such as a semiconducting substrate, or a Si or Ge substrate. Examples of II-VI substrates include, but are not limited to, a substrate comprising, consisting essentially of, or consisting of CdSe, CdTe, CdZnTe, or ZnTe. Semiconducting substrates comprising an epitaxial II-VI semiconductor layer on another substrate include, but are not limited to epitaxial CdSe, CdTe, CdZnTe, or ZnTe layers on a Si or Ge substrate, where the Si or Ge substrate can be intrinsic or n- or p-doped.

When formed over a semiconducting substrate, each building block can be lattice matched or pseudomorphically strained, or mismatched, to the semiconducting substrate. Alternatively, each building block can be lattice matched or pseudomorphically strained, or mismatched to one another.

In another embodiment of any of the preceding embodiments, an array of MBPDs, can be metal bump mounted to a readout integrated circuit (ROIC), wherein the first building block is in contact with the bumps. Such bump mounting can be according to any methods known in the art that are suitable for the purpose, for example, the mounting can be via indium bumps. The ROIC can be for example, one which does not require the change of bias polarity during operation.

Figure 4A:
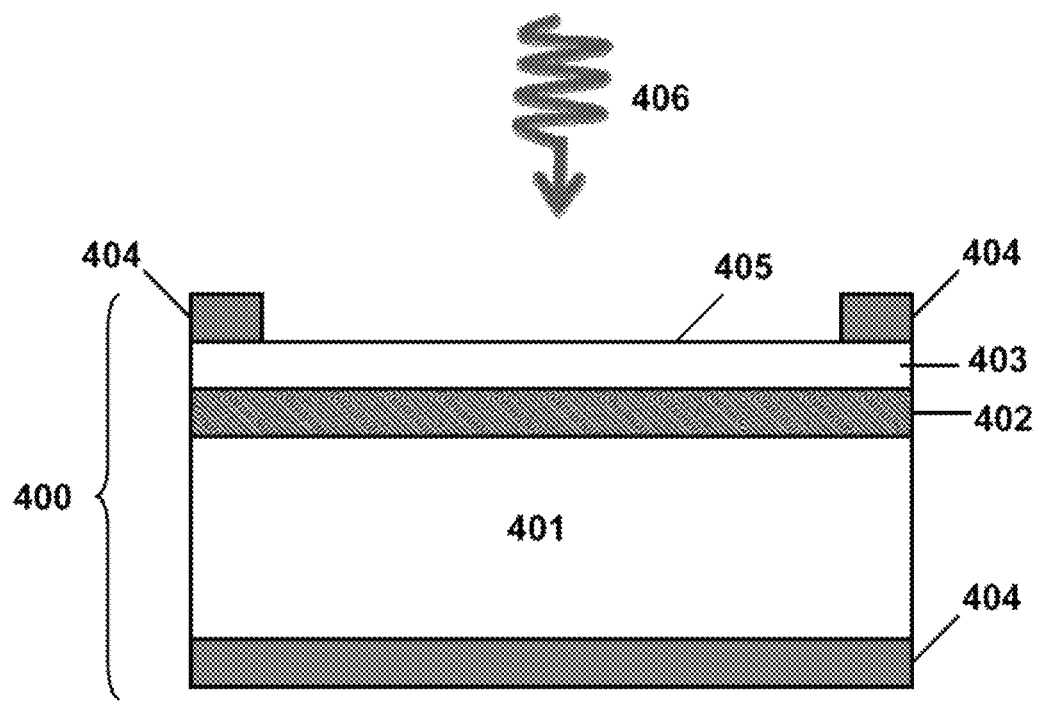
FIG. 4a is a cross-sectional drawing of an embodiment of a photodetector module as described herein.

As shown in FIG. 4a, in one embodiment, the MBPDs (400) can comprise a substrate (401) with a first building block (402) formed over the substrate and a ultimate building block (403) formed over the first building block (402), and contacts (404) for addressing the MBPD. In such an arrangement, a detecting surface (405) of the MBPDs is exposed to an optical signal (406) for detection.

Figure 4B:
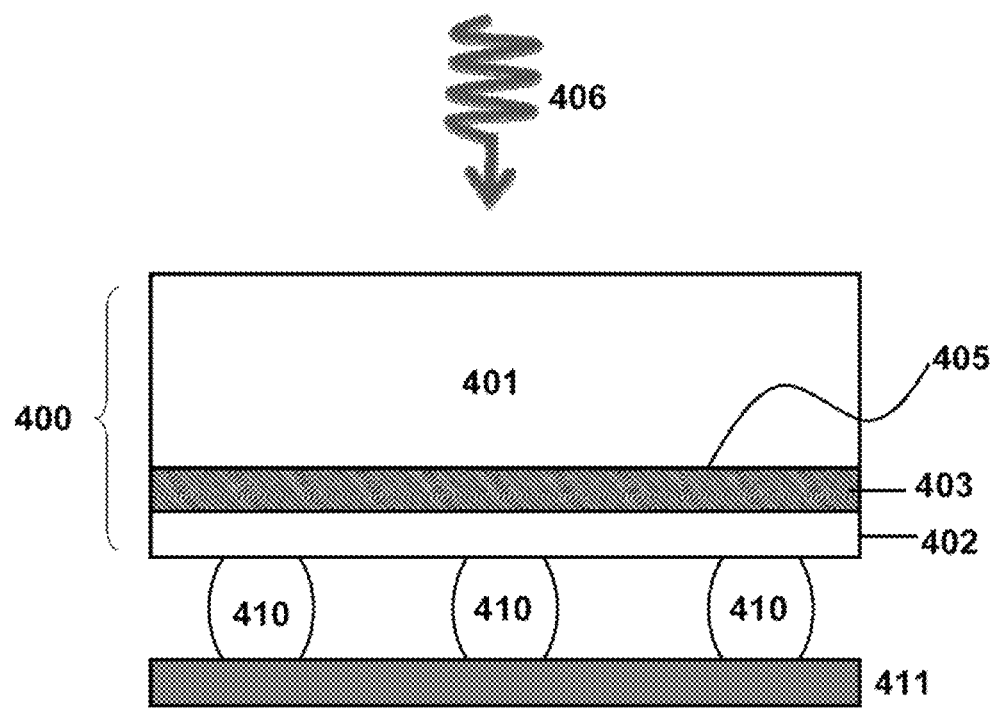
FIG. 4b is a cross-sectional drawing of an embodiment of a photodetector module as described herein where the MBPD or FPA is bump-mounted to a read-out integrated circuit (ROIC).

In another embodiment, as shown in FIG. 4b, the MBPD (400) can comprise a substrate (401) with an ultimate building block (403) formed over the substrate and a first building block (402) formed over the ultimate building block (403). The MBPD can be mounted to a ROIC (411) via metal bumps (410), such as In, in contact with the first building block (402). In such an arrangement, a detecting surface (405) of the MBPDs can be exposed to an optical signal (406) for detection.

Alternatively, in another embodiment, the MBPD can comprise a substrate with a first building block formed over the substrate and an ultimate building block formed over the first building block. The MBPD can be mounted to a ROIC via metal bumps, such as In, in contact with the ultimate building block. In such an arrangement, a detecting surface of the MBPDs can be exposed to an optical signal for detection.

Figure 4C:
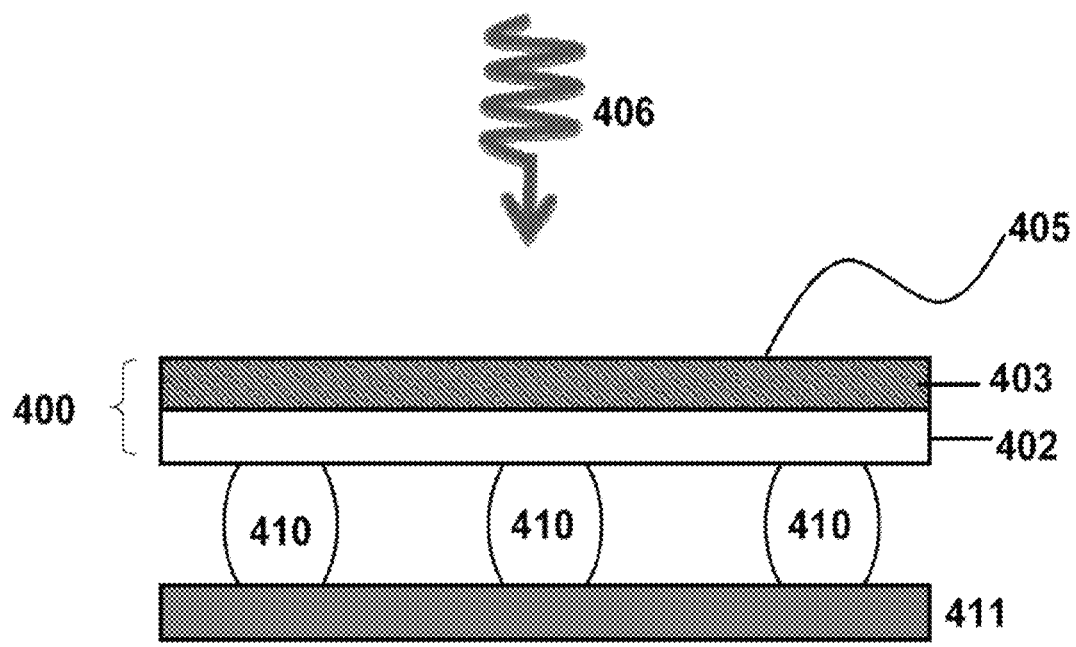
FIG. 4c is a cross-sectional drawing of an embodiment of a photodetector module as described herein where the MBPD or FPA is bump-mounted to an ROIC and the substrate has been removed.

In another embodiment, as shown in FIG. 4c, the MBPD (400) can comprise an ultimate building block (403) formed over a first building block (402), as shown in FIG. 4b, where the substrate has been removed according to methods familiar to one skilled in the art. The MBPD can be mounted to a ROIC (411) via metal bumps (410), such as In, in contact with the first building block (402). In such an arrangement, a detecting surface (405) of the MBPDs can be exposed to an optical signal (406) for detection.

Alternatively, in another embodiment, the MBPD can comprise an ultimate building block formed over a first building block, where the substrate has been removed according to methods familiar to one skilled in the art. The MBPD can be mounted to a ROIC via metal bumps, such as In, in contact with the ultimate building block. In such an arrangement, a detecting surface of the MBPDs can be exposed to an optical signal for detection.

In principle, the number of building blocks is unlimited, enabling an unlimited number of colors (e.g., visible, infrared, or ultraviolet) to be detected. Each of the MBPDs can comprise one or a plurality of building block between the first and ultimate building blocks. In an embodiment of any of the preceding embodiments, each MBPD further comprises (i) a third building block having a third detection band positioned between the first and ultimate building blocks, and the first, second, and third bandgaps are not identical; and (ii) when necessary a third light source having a third light spectrum that can be absorbed only by the third building block; wherein the third light source is positioned to illuminate the detecting surface of the MBPDs.

In an embodiment of any of the preceding embodiments, each MBPD further comprises (i) a fourth building block having a fourth detection band positioned between the first and ultimate building block, and the first, second, third, and fourth detection bands are not identical; and (ii) a fourth light source having a fourth light spectrum that can be absorbed only by the fourth building block; wherein the fourth light source is positioned to illuminate the detecting surface of the MBPDs.

In an embodiment of any of the preceding embodiments, each MBPD further comprises (i) a fifth building block having a fifth bandgap positioned between the first and ultimate building blocks, and the first, second, third, fourth, and fifth bandgaps are not identical; and (ii) a fifth light source having a fifth light spectrum that can be absorbed only by the fifth building block; wherein the fifth light source is positioned to illuminate the detecting surface of the MBPDs.

In an embodiment of any of the preceding embodiments, each MBPD further comprises (i) a sixth building block having a sixth bandgap positioned between the first and ultimate building blocks, and the first, second, third, fourth, fifth, and sixth bandgaps are not identical; and (ii) a sixth light source having a sixth light spectrum that can be absorbed only by the sixth building block; wherein the sixth light source is positioned to illuminate the detecting surface of the MBPDs.

Each of the light sources, in any of the preceding embodiments, can provide a light spectrum which can be substantially absorbed by one of the building blocks. For example, each light source can be a light emitting diode (LED), laser diode, or broadband light source with filters. The light sources are positioned such that the light they emit is in optical communication with the detecting surface of the MBPDs. For example, the light sources can be positioned on a separate surface from the MBPD. In another example, the light sources can be integrated on a chip with the MBPDs and the light can be guided to each individual MBPD using transparent waveguides, such as, but not limited to, ZnO. Each light source emits a light spectrum which can be absorbed by only one of the MBPD building blocks (i.e., the multi-band photodetector building blocks and light sources are color matched).

The materials used for the preceding building blocks can be any organic or inorganic semiconductors. When building blocks are made of lattice-matched II/VI (MgZnCdHg) (SeTe) and III/V InGaAsSb materials (see, Zhang et al., Proceedings of the 33rd IEEE Photovoltaic Specialists Conference, pp. 30, (2008)), and InAs/InAsSb or InAs/InGaSb type-II superlattices are adopted, the resulting building blocks can cover UV, visible, near IR, and far infrared wavelengths. In principle the number of the building blocks is unlimited if lattice-matched II-VI/III-V materials are used, enabling hyperspectral detection.

In one embodiment, each building block independently comprises III-V, II-VI, IV-IV, or IV-VI alloy layers or a mixture thereof. In another embodiment, each building block independently comprises III-V or II-VI alloy layers or a mixture thereof. In one embodiment, each building block independently comprises III-V or II-VI alloy layers. In one embodiment, each building block independently comprises III-V alloy layers. In one embodiment, each building block independently comprises II-VI alloy layers.

In another embodiment, each bipolar building block comprises a p-n junction having at least two alloy layers, wherein the alloy layers are independently III-V or II-VI alloy layers, wherein one alloy layer is p-doped and the other alloy layer is n-doped. In certain embodiments, at least one p-n junction comprises a II-VI alloy layer. In certain other embodiments, at least one p-n junction comprises a III-V alloy layer.

Each alloy layer can be doped with one or more dopants as is familiar to those skilled in the art. For example, Table 1 lists n- and p-doped materials which can be used according to the invention, their respective dopants, and maximum doping concentrations [n ($cm^{-3}$) or p ($cm^{-3}$)] of the dopant therein.

TABLE 1

| Materials | n- Dopants | n ($cm^{-3}$) | p- Dopants | p ($cm^{-3}$) |
|---|---|---|---|---|
| n-ZnSe | I | $>10^{18}$ | N | $4 \times 10^{17}$ |
| n-CdSe | Cl | $>10^{19}$ | N | $10^{17}$ |
| n-CdTe | I | $7 \times 10^{18}$ | N | $2 \times 10^{17}$ |
| n-ZnTe | Al, Cl | $<4 \times 10^{18}$ | P, N | $3 \times 10^{19}$ |
| n-MgSeTe | Cl | $\sim 10^{19}$ | N | $7 \times 10^{17}$ |
| n-AlGaAsSb | Te | $3 \times 10^{18}$ | Be, C | $1 \times 10^{19}$ |
| n-GaSb | Te | $7 \times 10^{18}$ | Be, C | $1 \times 10^{19}$ |

In certain other embodiments, each bipolar building block further comprises a third layer contacting the photodetectors. In one embodiment, the third layer comprises the same or different alloy as the photodetector and is $p^+$, P, $n^+$, or N-doped. In certain embodiments, each bipolar building block comprises three layers of the form $p^+$pn, pnn$^+$, Ppn, or pnN. In one example, each bipolar building block comprises three layers of the form $p^+$pn.

In certain other embodiments, each bipolar building block further comprises a third and a fourth layer. In one embodiment, the third layer comprises the same or different alloy as the photodetector and is P or $p^+$ doped; and the fourth layer comprises the same or different alloy as the photodetector and is N or $n^+$ doped. In certain embodiments, each building block comprises four layers of the form PpnN, $p^+$pnN, $p^+$pnn$^+$, or Ppnn$^+$.

In certain other embodiments, a bipolar building block comprises an unintentionally doped, intrinsic layer ("I"). In certain embodiments, each bipolar building block comprises layers of the form pIn, PIn, or pIN.

When at least one alloy layer is a III-V alloy layer, then each III-V alloy layer can independently comprise a binary, ternary, or quaternary (InGaAl)(AsSb) alloy. Suitable III-V alloys include, but are not limited to, GaAs, GaSb, AlGaAs, InAsSb, GaInSb, GaInAsSb, or AlGaAsSb.

When at least one alloy layer is a II-VI alloy layer, then each II-VI alloy layer can independently comprise a binary, ternary, or quaternary (MgZnCdHg)(SeTe) alloy. Suitable II-VI alloys include, but are not limited to, ZnTe, CdZnTe, CdSeTe, MgSeTe, ZnCdSeTe, HgCdTe, HgCdSe, or CdHgSeTe.

In an embodiment of any of the preceding, each of the II-VI and/or III-V alloy layers is lattice-matched or pseudomorphically strained to one another. In one embodiment, each of the II-VI and/or III-V alloy layers is lattice-matched to one another. In one embodiment, each of the II-VI and/or III-V alloy layers is pseudomorphically strained to one another.

In general, the detection bands of each of the building blocks, unipolar or bipolar, can be chosen to collect light over a spectrum ranging from infrared wavelengths through the entire visible spectrum. For example, in one embodiment, the bandgap of each of the building blocks is between about 0.012 and about 6.2 eV.

In certain of the preceding embodiments, each of the building blocks has a detection band energy greater than the layer it is formed over. In other certain of the preceding embodiments, each of building blocks has a detection band energy less than the layer it is formed over.

In general, each of the bipolar building blocks comprises at least one alloy layer which is predominantly responsible for absorption of light by that particular building block. The thickness of each alloy layer which is predominantly responsible for absorption of light can be optically-thick to provide a sharp absorption edge for each detector. Such alloy layers can have a thickness between, for example, about 0.01 μm and about 15 μm for direct bandgap or superlattice materials and about 10 μm and about 150 μm or thicker.

In one embodiment, a unipolar building block can be a quantum well infrared photodetector (QWIP). The QWIP can be AlGaAs barrier, GaAs quantum well (QW) design, where the QW is confined between barriers. Each QWIP period consists of a pair of QW and barriers, which is grown on top of each other, repeatedly, to achieve enough absorption coefficient in this building block.

In one embodiment, if a unipolar building block is QWIP, its quantum wells can either be doped p-type or n-type, which can be named n-QWIP and p-QWIP respectively. Its neighboring building block in a MBPD can be another unipolar or bipolar building block.

In one embodiment, a unipolar building block can be an nBn photodetector, which comprises or consists of at least three layers, one emitter narrow bandgap layer, one large bandgap layer blocking electron flow and one narrow bandgap absorber layer, where the large bandgap layer blocking electron flow is disposed between the emitter narrow bandgap layer and the narrow bandgap absorber layer. If a building block is a unipolar nBn detector, the barrier layer can be n-doped.

In one embodiment, a unipolar building block can be pBp photodetector, which comprises or consists of at least three layers, one emitter narrow bandgap layer, one large bandgap layer blocking hole flow and one narrow bandgap absorber layer, where the large bandgap layer blocking hole flow is disposed between the emitter narrow bandgap layer and the narrow bandgap absorber layer. If a building block is a unipolar pBp detector, the barrier layer can be p-doped.

In one embodiment, when two successive building blocks are both bipolar, a tunnel junction can be utilized between two. In this case, bipolar building blocks should be connected in series with the same polarity, and the tunnel junction between them should be connected in series with reverse polarity. The tunnel junction can either be homojunction or heterojunction device comprising but not limited to InP/InGaAs, AlGaAs/GaAs, InAs/GaSb and InAs/AlSb materials.

In one embodiment, a bipolar building block can be a bipolar phototransistor. This phototransistor can be a homojunction device, comprising but not limited to ZnTe, GaSb, GaAs, AlGaAs, InP, InGaAs and InSb materials. This bipolar phototransistor can be a heterojunction device comprising but not limited to AlGaAs/GaAs, InP/InGaAs and InAs/GaSb materials.

In one embodiment, a building block can itself be a two-band photodetector switchable with voltage-polarity change, which detects one band in positive bias and another band in negative bias. Or a building block can be a two band photodetector switchable with voltage-magnitude change, which detects one band in certain magnitude of electrical bias voltage, and the other band at a different magnitude of electrical bias voltage.

In one embodiment, if a building block itself is a two-band voltage-polarity switchable photodetector, it can be NBn, PBp, nBN, or pBP type photoconductive device where P and N represents larger detection bandgap energy, and n and p represents lower detection bandgap energy, and the detection bands are different, the layers can be comprising but not limited to InAs/GaSb, InAs/InGaSb, InAs/InAsSb, $Hg_{1-x}Cd_xTe/Hg_{1-y}Cd_yTe$ materials. Lower bandgap energy corresponds to range 0 eV to 6 eV, where larger detection bandgap energy defines the bandgap to be at least 10 meV larger than the other bandgap.

In one embodiment, if a building block is a two-band voltage polarity switchable photodetector, it may detect one photodetection band in positive electrical bias, and detect a second photodetection band in negative electrical bias.

In one embodiment, if a building block itself is a two-band voltage-magnitude switchable photodetector, it can be series combination of mid-wavelength (MWIR, 3-5 µm) QWIP and long-wavelength (LWIR, 8-12 µm) QWIP, shown as MWIR QWIP/LWIR QWIP. This building block can also be series connected LWIR nBn superlattice (SL) device and MWIR nBn SL device. This building block can also be series connected LWIR pBp SL device and MWIR pBp SL device.

In one embodiment, if a building block is itself a two-band voltage magnitude switchable photodetector, it detects one photodetection band at a certain electrical bias magnitude, and detects second photodetection band at a different certain electrical bias magnitude.

In one particular embodiment, the layer structure for an example of a two-band MBPD is schematically shown in FIG. 5, comprising AlGaAs/GaAs bipolar PIN photodetector (from visible to near-infrared (NIR)), and AlGaAs/GaAs QWIP (far IR, 8 µm to 9 µm) building blocks formed over a GaAs substrate.

In one particular embodiment, the layer structure for an example of a four-band MBPD is schematically shown in FIG. 6, comprising InP Heterojunction Phototransistor (from visible to NIR), InGaAs PIN photodetector (SWIR, NIR to 1.7 µm), AlInAs/InGaAs QWIP (MWIR, a band in 3.0 µm to 5.0 µm range), InP/InGaAs QWIP (LWIR, a band in 7.0 µm to 14.0 µm range)

In another particular embodiment, the layer structure for an example of a four-band MBPD is schematically shown in FIG. 7, comprising ZnTe (from green to UV), GaSb (SWIR, 1.6 µm to green), InAs/InAsSb nBn two-band MWIR/LWIR device (midwave IR, 5 µm to 1.6 µm, and InAs/InAsSb or InAs/InGaSb type-II superlattice (far IR, 12 µm to 5 µm) building blocks formed over a GaSb substrate. In this particular embodiment, optical biasing switching and electrical bias switching can be used in conjunction to switch detection bands.

Since the biasing light sources (e.g., LEDs) can be mounted very close to the MBPDs, their light intensities can be orders of magnitude greater than the signal light intensity. As a result, the total current of the MBPD is dictated by the detecting photodetector. Therefore, the total current read by a ROIC only gives the optical signal strength of that specific band of the detecting photodetector.

With some simple algorithms, one can easily use such a MBPD to detect different wavelengths, or bands, and to acquire multicolor images, which enables the monolithically integrated hyperspectral FPA.

Figure 8:
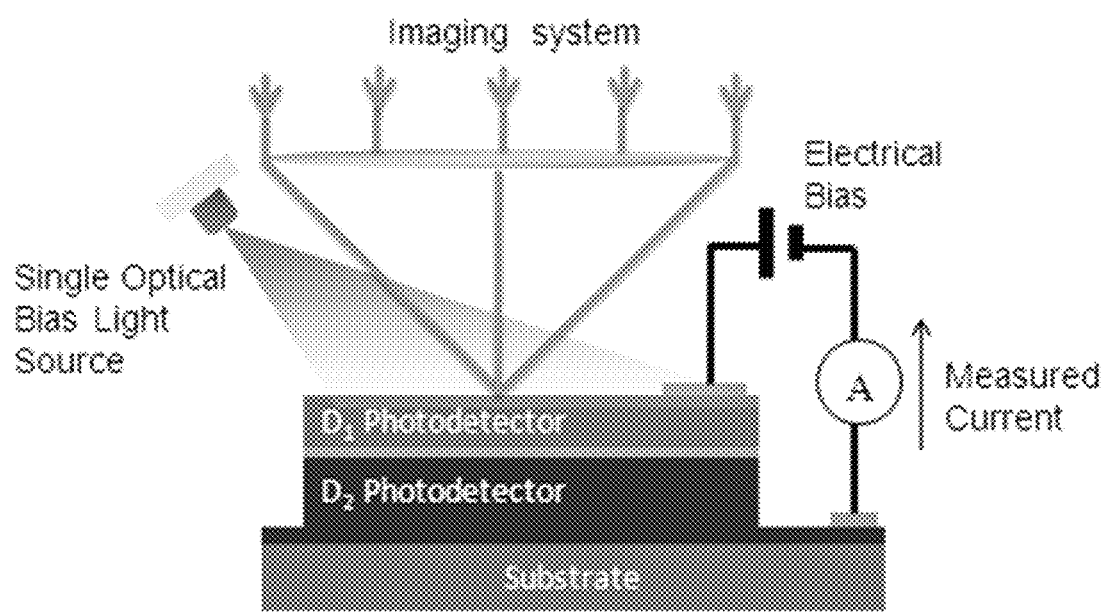
FIG. 8 is a schematic diagram of the operation modes for a discrete MBPD. The optically biased photodetector $D_1$ is operating in photovoltaic mode, while the detecting photodetector $D_2$ operates in photoconductive mode; the total current is therefore dictated by the current from the $D_2$, which is proportional to the light intensity at the detecting wavelength or band.

A schematic diagram of the operation modes for a two-band photodetector is shown in FIG. 8. In this example, the second photodetector $D_2$ is the detecting device, and the other photodetector $D_1$ is optically biased. The total current is therefore dictated by the current from the detecting photodetector, which is proportional to the light intensity at the detecting wavelength or band.

In another aspect, the present disclosure provides methods for collecting an optical signal comprising illuminating the detecting surface of an MBPD as described in any of the preceding aspect and any embodiment thereof, with one or more light sources to optically bias all except for one of the building blocks within each of the individual MBPDs; exposing the detecting surface to an optical signal to generate a photodetector response; and collecting the photodetector response.

Assuming that we have N building blocks with M light sources (e.g., LEDs) for optical biasing, the total current of the entire photodetector is determined by the ith building block. During detection, light source corresponding to ith building block is turned off while all the other light sources (LEDs) are on. That is, the detecting surface is illuminated with some light sources for some building blocks that are optically biased. Some building blocks will have lower electrical impedance and will not need optical biasing light sources. The illumination can be simultaneously illuminating the detecting surface with one or more light sources to optically bias all except for one or more of the building blocks within each of the individual MBPDs.

In one embodiment, the methods further comprises controlling the one or more light sources to change which one of the building blocks is not optically biased. The light sources can be switched on and off in a predetermined pattern such that the one building block which is not optically biased is serially rotated among the available building blocks.

In one embodiment, some of the building blocks will have low electrical impedance than the others, such that, the low electrical impedance blocks will not demand optical biasing light sources.

In one embodiment, a change of electrical bias voltage magnitude, polarity or both, can switch a building block ON, or OFF, or to another band. Electrical bias and optical bias change can be done simultaneously during MBPD operation. A suitable electrical bias can be readily be determined by one skilled in the art; for example the bias can be in the range from +/−10 V.

A photodetector response is measured for each of the building blocks while it is not being biased. In certain embodiments, the optical signal can be modulated during measurement according to methods known in the art.

Then, an algorithm can be used to determine the intensity of the light absorbed by each building block.

In certain embodiments, the measured photodetector response is an electrical current. In certain other embodiments, the measured photodetector response is a voltage.

Crosstalk between different band photodetectors may be a potential issue. There are two possible scenarios which can cause crosstalk between different photodetectors in the multiband configuration: (1) strong bias light from a top building block can penetrate it and be absorbed by the one underneath it; (2) the bias light for a bottom building block can be also absorbed by the tail states of the top building block; (3) optically biased photodetector can still respond to photons in its own detection band, and the created photocurrent can be observed at the output due to finite ac-impedance values of the photodetectors.

Crosstalk can be addressed, for example, by (1) adding an optical modulator, such as a chopper, and using a lock-in technique to modulate the signal light; then, the AC signal can be easily distinguished from the DC biases; or (2) adding a shutter. From time to time, the shutter can be closed to calibrate all the pixels to electronically eliminate any possible crosstalk caused by the bias lights. Since LEDs are very stable light sources, such a calibration would only need to be carried out in large time intervals.

DEFINITIONS

Herein, a notation is used to refer to alloys having the form of two sets of elements each within its own set of parenthesis; for example, (ABCD)(EFGH). This notation means that the alloy comprised at least one element selected from A, B, C, and D, and at least one element selected from E, F, G, and H. When this notation is used in combination with the modifiers such as "binary", "ternary", "quaternary", "quinary", or "senary", among others, it means that the alloy contains a total of 2, 3, 4, 5, or even 6 elements, respectively, provided that at least one element selected from A, B, C, and D, and at least one element selected from E, F, G, and H. For example, a ternary (InGaAl)(AsSb) alloy includes both InAsSb and GaAlSb, among other combinations.

The term "II-VI alloy" as used herein means an alloy where the constituent elements are selected from Groups IIA, IIB, and VIA, of the periodic table, wherein at least one constituent element is selected from Groups IIA and/or IIB of the periodic table and at least one constituent element is selected from Group VIA of the periodic table. Examples of II-VI alloys include, but are not limited to (a) binary alloys such as, but not limited to, Cadmium selenide (CdSe), Cadmium sulfide (CdS), Cadmium telluride (CdTe), Zinc oxide (ZnO), Zinc selenide (ZnSe), Zinc sulfide (ZnS), and Zinc telluride (ZnTe); (b) ternary alloy such as, but not limited to, Cadmium zinc telluride (CdZnTe, CZT), Mercury cadmium telluride (HgCdTe), Mercury zinc telluride (HgZnTe), and Mercury zinc selenide (HgZnSe); and (c) quaternary alloys such as, but not limited to, Cadmium mercury selenide telluride (CdHgSeTe) and Cadmium zinc selenide telluride (CdZnSeTe).

The term "III-V alloy" as used herein means an alloy where the constituent elements are selected from Groups IIIA and VA of the periodic table, wherein at least one constituent element is selected from Group IIIA of the periodic table and at least one constituent element is selected from Group VA of the periodic table. Examples of III-V alloys include, but are not limited to (a) binary alloys such as, but not limited to, Aluminum antimonide (AlSb), Aluminum arsenide (AlAs), Aluminum nitride (AlN), Aluminum phosphide (AlP), Boron nitride (BN), Boron phosphide (BP), Boron arsenide (BAs), Gallium antimonide (GaSb), Gallium arsenide (GaAs), Gallium nitride (GaN), Gallium phosphide (GaP), Indium antimonide (InSb), Indium arsenide (InAs), Indium nitride (InN), and Indium phosphide (InP); (b) ternary alloys, but not limited to, Aluminum gallium arsenide (AlGaAs, $Al_xGa_{1-x}As$), Indium gallium arsenide (InGaAs, $In_xGa_{1-x}As$), Aluminum indium arsenide (AlInAs), Aluminum indium antimonide (AlInSb), Gallium arsenide nitride (GaAsN), Gallium arsenide phosphide (GaAsP), Aluminum gallium nitride (AlGaN), Aluminum gallium phosphide (AlGaP), Indium gallium nitride (InGaN), Indium arsenide antimonide (InAsSb), and Indium gallium antimonide (InGaSb); (c) quaternary alloys such as, but not limited to, Aluminum gallium indium phosphide (AlGaInP, also InAlGaP, InGaAlP, AlInGaP), Aluminum gallium arsenide phosphide (AlGaAsP), Indium gallium arsenide phosphide (InGaAsP), Aluminum indium arsenide phosphide (AlInAsP), Aluminum gallium arsenide nitride (AlGaAsN), Indium gallium arsenide nitride (InGaAsN), and Indium aluminum arsenide nitride (InAlAsN); and (d) quinary alloys such as, but not limited to, Gallium indium nitride arsenide antimonide (GaInNAsSb). Higher order alloys include, for example, the senary alloy Indium gallium aluminum arsenide antimonide phosphide InGaAlAsSbP.

The term "IV-IV alloy" as used herein means an alloy where the constituent elements are selected from Group IV of the periodic table.

The term "IV-VI alloy" as used herein means an alloy where the constituent elements are selected from Group IV, of the periodic table, and at least one constituent element is selected from Group VIA of the periodic table.

The term "bandgap" or "$E_g$" as used herein means the energy difference between the highest occupied state of the valence band and the lowest unoccupied state of the conduction band of the material. The bandgap for a building block, as used herein, refers to the bandgap of the material that forms the p-n junction.

The term "detection band" as used herein means the range of photon wavelengths, where each building block photodetector is able to respond. It can either be defined by the bandgap of the comprised materials, or can be defined by intersubband transitions in comprised quantum structures.

The term "lattice matched" as used herein means that the two referenced materials have the same or lattice constants differing by up to +/−0.2%. For example, GaAs and AlAs are lattice matched, having lattice constants differing by ~0.12%.

The term "pseudomorphically strained" as used herein means that layers made of different materials with a lattice parameter difference up to +/−2% can be grown on top of other lattice matched or strained layers without generating misfit dislocations. In certain embodiments, the lattice parameters differ by up to +/−1%. In other certain embodiments, the lattice parameters differ by up to +/−0.5%. In further certain embodiments, the lattice parameters differ by up to +/−0.2%.

The term "mismatched" as used herein, means that that the two referenced materials have a lattice parameter difference greater than +/−2%.

The term "bipolar" as used herein means that both electrons and holes carry photocurrent in the building block.

The term "unipolar" as used herein means that only electrons or only holes carry photocurrent in the building block.

The term "building block" as used herein, means a p-n junction, or a multiple quantum well (MQW) structure, or a superlattice (SL) structure having at least two layers of similar or dissimilar materials.

If the building block is a p-n junction, the layers can be doped n and p type, where the absorption edge of this p-n junction defines the bandgap of the building block, as defined herein. However, such building blocks can comprise multiple layers. For example, a building block can comprise a p-n junction and a third doped layer to form a $Ppn^+$ structure, wherein the P region can comprise material that has the same or larger bandgap than that of the p-n region, or a building block can comprise a p-n junction and one additional doped layer on each side of the p-n junction to form a PpnN structure, wherein the P and the N regions can comprise materials that have the same or larger bandgap than that of the p-n junction region.

If the building block is a multiple quantum well structure, there are at least two different layers with different bandgaps. The low bandgap layers have lower thickness than the large bandgap layers. One or more of the larger bandgap materials are called barrier materials, and one or more of the smaller bandgap materials are called well materials. One period of the multiple quantum well (MQW) consists of at least one barrier material layer and at least one well material layer. A single period is repeatedly grown on the substrate one after another. For example, the period can be repeated up to 100 times, or up to 50 times, or up to 30 times, or up to 20 times, or up to 10 times. The quantum wells can be doped n-type or p-type.

If the building block is a superlattice (SL) structure, there are at least two different layers with different bandgaps, comprising a first material having first bandgap, and an ultimate material having an ultimate bandgap. One period of the SL consists of at least two different materials, with comparable layer thickness. A single period is repeatedly grown on the substrate one after another with a range of 5 to 1000 repeats. Any of the layers can be doped n-type or p-type.

The term "layer" as used herein, means a continuous region of a material (e.g., an alloy) that can be uniformly or non-uniformly doped and that can have a uniform or a non-uniform composition across the region.

The term "tunnel diode" as used herein, means a region comprising two heavily doped layers with n- and p-type, respectively. Both of these layers can be of the same materials (homojunction) or different materials (heterojunction).

The term "p-doped" as used herein means atoms have been added to the material (e.g., an alloy) to increase the number of free positive charge carriers.

The term "n-doped" as used herein means atoms have been added to the material (e.g., an alloy) to increase the number of free negative charge carriers.

The term "p$^+$-doped" as used herein means atoms have been added to the material (e.g., an alloy) to increase the number of free positive charge carriers such that the material is degenerate, as is known to those skilled in the art.

The term "n$^+$-doped" as used herein means atoms have been added to the material (e.g., alloy) to increase the number of free negative charge carriers such that the material is degenerate, as is known to those skilled in the art.

The term "P-doped" as used herein means the material is p-doped, as defined herein, and the bandgap of the material is the same or greater than the p-doped material of a p-n junction.

The term "N-doped" as used herein means the material is n-doped, as defined herein, and the bandgap of the material is the same or greater than the n-doped material of a p-n junction.

EXAMPLES

Example 1

An NIR PIN photodetector and an LWIR QWIP were connected in series. This proposed device design utilized an 8-9 μm AlGaAs/GaAs LWIR QWIP, and an NIR AlGaAs/GaAs PIN photodiode. Such a combination took advantage of the mature GaAs technology. An exemplar epilayer design for front-side illumination configuration and 77 K operation is shown in Table 2. The shorter wavelength NIR PIN device was designed on top of the LWIR QWIP on a GaAs substrate. The PIN photodetector had a 500 nm AlGaAs window layer, and a 2500 nm thick GaAs intrinsic layer, followed by a 500 nm GaAs n-contact layer. The QWIP was a standard design consisting of 16 times of 4.0 nm GaAs quantum wells sandwiched between 50 nm $Al_{0.27}Ga_{0.73}As$ barriers. The bottom contact layer was 1000 nm thick n-type GaAs. The device was a combination of a bipolar device with a unipolar device and does not need the use of tunnel junctions between them.

TABLE 2

Front side illuminated device layer structure.

| Layer ID | Material | d (nm) | Type | Comments | Repeat Group |
|---|---|---|---|---|---|
| 8 | GaAs | 10 | P | Cap layer | |
| 7 | AlGaAs | 500 | P | Top contact layer and window | |
| 6 | GaAs | 2500 | I | NIR active region | |
| 5 | GaAs | 500 | N | Mid contact layer | |
| ... Repeat the multi-quantum well period Group 1 = (Layer 3 + 4), for a total of 16 periods ... | | | | | |
| 4 | $Al_{0.27}Ga_{0.73}As$ | 50 | Undoped | Barrier | 1 |
| 3 | GaAs | 4.0 | N | Well | 1 |
| 2 | $Al_{0.27}Ga_{0.73}As$ | 50 | Undoped | Barrier | |
| 1 | GaAs | 1000 | N | Bottom contact Layer | |
| Sub | S.I. GaAs | | Semi Insulating | (100) GaAs | |

Figure 10:
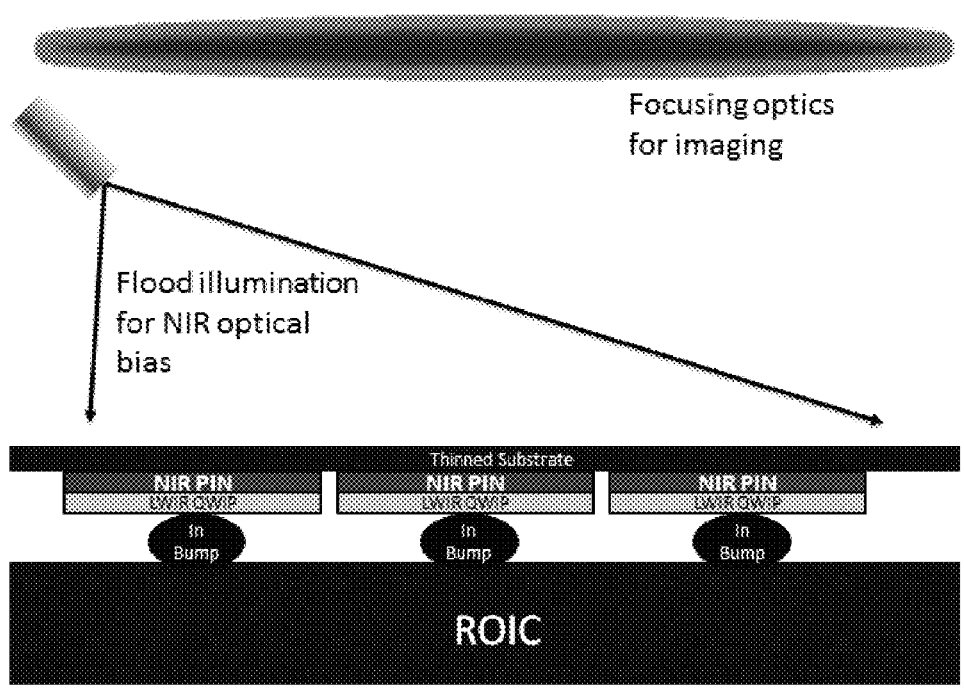
FIG. 10 shows designed NIR/LWIR optically-addressed dual-band FPA configuration using single optical bias source for optical addressing.

For the alternative configuration of backside illumination, substrate thinning was necessary as the GaAs substrate absorbed incoming NIR signal. An optical system of backside illuminated NIR/LWIR optically-addressed dual-band FPA is described in FIG. 10. The proposed FPA design has single indium-bump per pixel. It makes use of single optical bias source in flood illumination. Extension of the technique to three or more band detectors was possible by using more optically-addressed detector stacks or by using voltage tuning and bias polarity switching techniques.

According to AC circuit model similar to that shown in FIG. 2d, in the default mode of operation without optical bias, the device detects NIR band. The NIR PIN device will have lower dark current than the LWIR QWIP due to larger activation energy. The total current flowing through the device will be determined by the current in the PIN diode. In the LWIR detection mode, the optical bias on the NIR device is on. The bias level and devices should be designed such that when optical bias is on, the QWIP should be the current limiting device. In this case a photovoltaic voltage will develop on the PIN device and it will bias the QWIP more. Under the described operating conditions, each photodetector should operate close to the signal-to-noise ratio performance of its single band counterparts.

Figure 11A:
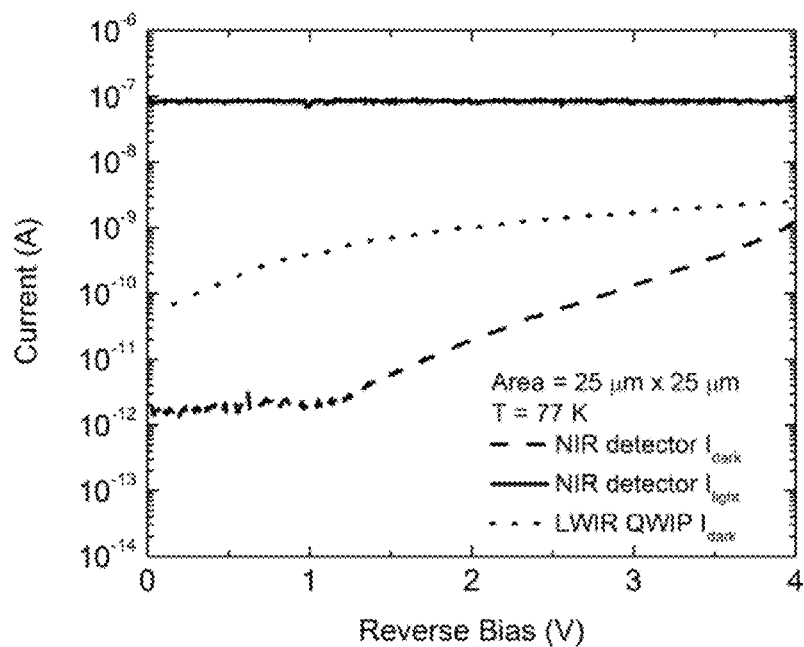
FIG. 11 shows NIR and LWIR photodetector I-V curves in reverse bias (mesa top negative). The NIR detector photocurrent is calculated from the measured current density. The currents for a 25 μm×25 μm size pixel under dark condition and under optical bias light are plotted in 11a. The AC resistances of the LWIR QWIP and the NIR PIN show that the NIR photodetector can have five orders of magnitude change in AC resistance 11b.
Figure 11B:
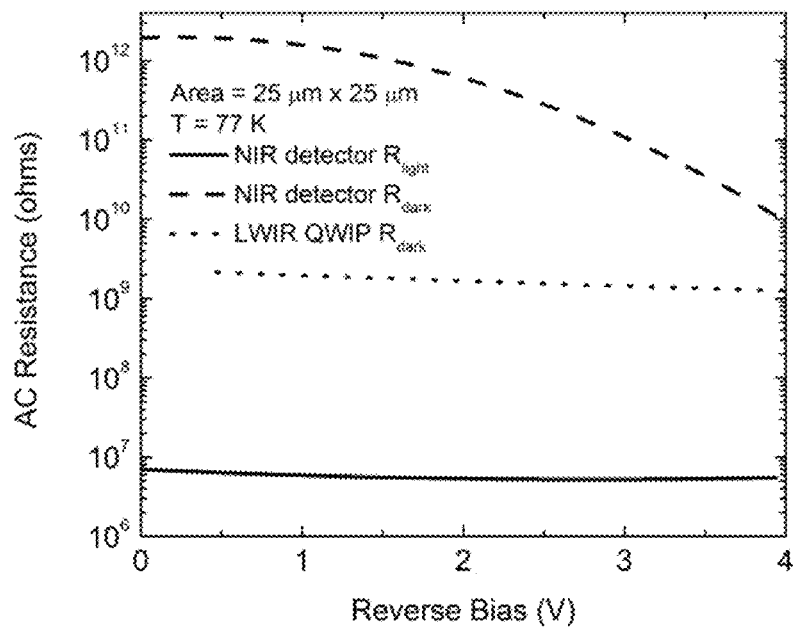

The device operation was analyzed using the data published in the literature for QWIPs and single junction GaAs solar cells. The AlGaAs/GaAs LWIR QWIP I-V characteristics are well characterized in the literature. The characteristics of the NIR photodiode, i.e. the GaAs single junction, were obtained by measuring a 1 cm$^2$ commercial device at 77 K using a white halogen illumination source. The resulting I-V curves are shown in FIG. 11a. When optical bias is off, current passing through the NIR photodiode is more than two orders of magnitude less than that of the QWIP device at 77K. When optical bias is on, the photocurrent generated by the NIR photodiode is two orders of magnitude higher than the QWIP current. The results showed that it is possible to achieve high DC current contrast with optical addressing. FIG. 11b shows AC resistances calculated from the I-V characteristics. At the typical operation point of 1 V reverse bias for the QWIP (mesa top negative) device, the NIR photodiode AC resistance can be made at least two orders of magnitude less than the QWIP AC resistance. In this case, the device operates in the LWIR mode. As shown in FIG. 11b, turning optical bias off makes NIR device AC resistance two orders of magnitude higher than QWIP AC resistance. In this case, the device operates in the NIR mode. This showed that optical addressing can be used to switch between NIR and LWIR detection modes. Noise mechanism switching was also expected to be observed in both NIR and LWIR bands.

The AlGaAs and GaAs layers of the NIR photodiode have absorption coefficient on the order of $10^4$ cm$^{-1}$ above their bandgaps at 77K and the active layer absorbs 97% of the light with energy above GaAs cutoff wavelength of 820 nm. The remaining 3% photons in NIR band are able to excite electron-hole pairs in QWIP only if their energies are above the quantum well effective bandgap. Among those, the lower energy electron-hole pairs are not able to escape from the quantum wells, and thus do not contribute to LWIR photocurrent. Although AlGaAs window layer absorbs the higher energy photons, there are still some high energy photons reaching the QWIP to cause crosstalk. Suitable low-pass NIR filtering is applied in this case. In summary, in LWIR mode when NIR optical signal is detected in the NIR device, its impact on the output was suppressed. Without being bound to any particular theory, crosstalk in optical-addressing architecture is reduced with two mechanisms: i) crosstalk signal is optically attenuated in the preceding detector layers, and ii) the absorbed signal is suppressed in the electrical circuit due to small AC resistance of the optically-biased photodetector.

Figure 12:
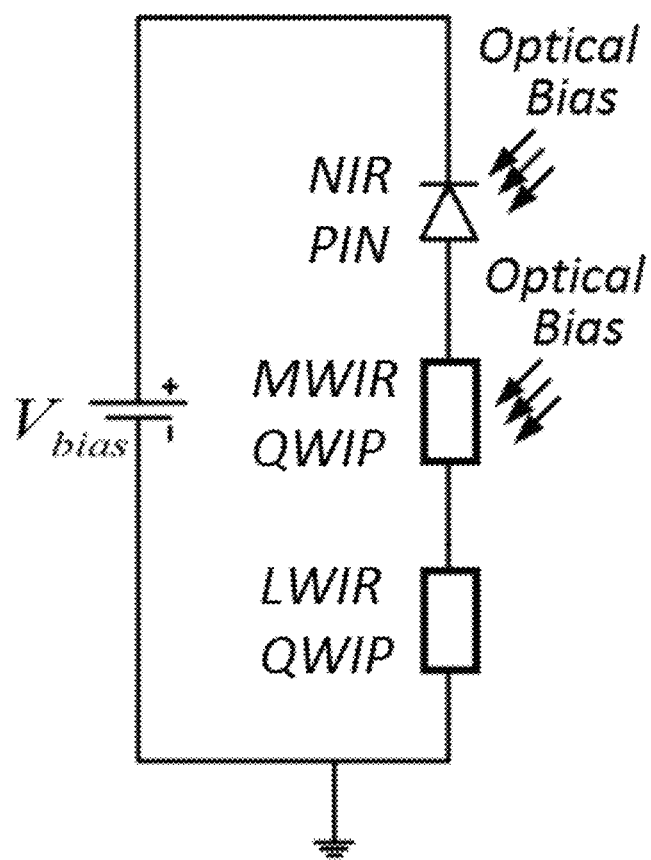
FIG. 12 illustrates a circuit diagram of the optically-addressed three-band photodetector consisting of an NIR PIN photodetector, an MWIR QWIP and an LWIR QWIP. Optical bias can be used on the NIR and the MWIR photodetectors. Alternatively MWIR/LWIR band switching can be done by voltage-tuning.

Similar architecture can be extended to NIR/MWIR/LWIR three-band detector design. The AC resistance plot in FIG. 11b shows that it is possible to add an MWIR device to the series stack with a suitable AC resistance. FIG. 12 shows the circuit diagram of such an NIR/MWIR/LWIR device. While NIR and MWIR bands are both optically addressed, the LWIR/MWIR addressing can be done by voltage tuning as well. According to modeling calculations, less than 10% optical cross talk between the bands, requires that the active photodetector's AC resistance should be at least one order of magnitude higher than the sum of the AC resistances of the other photodetectors. In order operate in MWIR detection mode, FIG. 11b shows that there is enough margin to engineer the AC resistance of the MWIR photodetector in the NIR/LWIR stack. Due to lower photon energy in MWIR band, when compared to the photon energy in NIR band, optical-addressing with MWIR optical bias creates less heat load on the cooler cold finger than it does with NIR optical-addressing.

Additional example of AlGaAs/GaAs pn junction PIN type photodetector, and an AlGaAs/GaAs quantum well infrared photodetector (QWIP) device layer structure is shown in Table 3:

TABLE 3

Device layer structure for two-terminal two-band photodetector.

| Layer | Material | d (nm) | Type | Comments | Repeat Group |
|---|---|---|---|---|---|
| 124 | GaAs | 10 | p-type $1 \times 10^{18}$ cm$^{-3}$ | Cap Layer | |
| 123 | Al$_{0.27}$Ga$_{0.73}$As | 500 | p-type $1 \times 10^{18}$ cm$^{-3}$ | Top contact layer and window | |
| 122 | GaAs | 2500 | n-type $2 \times 10^{16}$ cm$^{-3}$ | NIR active region | |
| 121 | GaAs | 500 | n-type $1 \times 10^{18}$ cm$^{-3}$ | Mid contact layer | |
| ... Repeat the multi-quantum well period Group 1 = (Layer 3 + 4 + 5 + 6), for a total of 30 periods ... | | | | | |
| 6 | Al$_{0.27}$Ga$_{0.73}$As | 50 | Undoped | Barrier | 1 |
| 5 | GaAs | 0.25 | Undoped | Well | 1 |
| 4 | GaAs | 4 | n-type $4 \times 10^{17}$ cm$^{-3}$ | Well, center doping | 1 |
| 3 | GaAs | 0.25 | Undoped | Well | 1 |
| 2 | Al$_{0.27}$Ga$_{0.73}$As | 50 | Undoped | Barrier | |
| 1 | GaAs | 1000 | n-type $1 \times 10$ cm$^{-3}$ | Bottom contact Layer | |
| Sub | S.I. GaAs | | Semi Insulating | | |

Example 2

The device was grown with molecular beam epitaxy on (100) GaAs substrate. The QWIP sub-photodetector structure consisted of a 1000 nm thick $10^{18}$ cm$^{-3}$ Si doped n-type GaAs layer for a bottom contact and an absorbing layer consisted of 30 periods of 4.6 nm GaAs quantum wells with 50 nm Al$_{0.27}$Ga$_{0.73}$As barriers. The center 4.0 nm regions in the quantum wells were n-doped with Si at $4\times10^{17}$ cm$^{-3}$. On top of the QWIP structure, the layers of the p-i-n sub-photodetector were grown in following sequence: 500 nm n-GaAs doped with Si at $10^{18}$ cm$^{-3}$, 2500 nm n-GaAs doped with Si at $2\times10^{16}$ cm$^{-3}$ and 400 nm p-Al$_{0.27}$Ga$_{0.73}$As window layer doped with C at $10^{18}$ cm$^{-3}$ concentration. The cap layer was a 10 nm p-GaAs doped with C at $1.4\times10^{18}$ cm$^{-3}$. The device mesa size 150 μm×150 μm was defined by wet chemical etching. The packaged photodetector was mounted in a cryostat with a ZnSe front window and a quartz side window. The ZnSe front window was used for normal incidence optical response characterization, while the quartz window was used for the optical biasing light.

Figure 13:
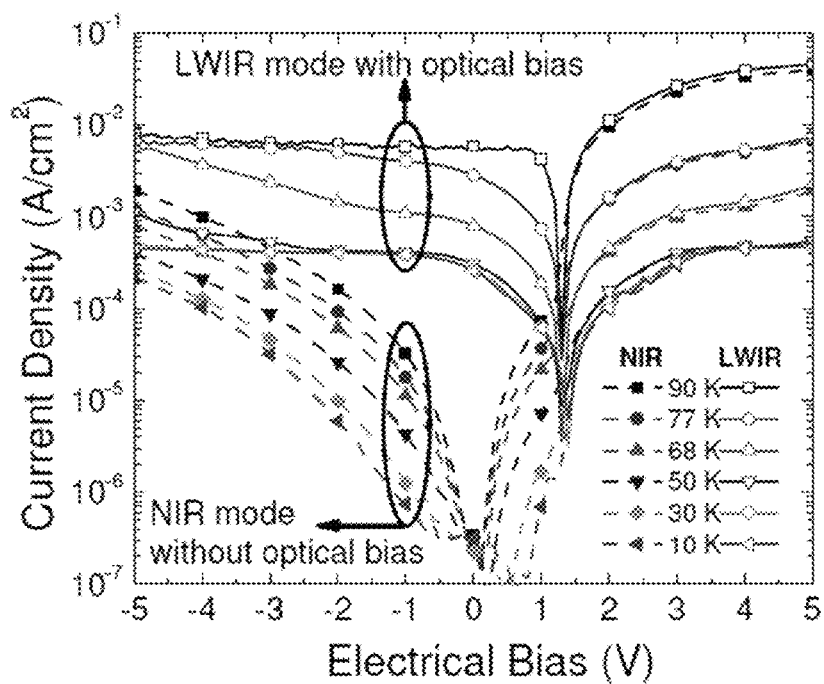
FIG. 13 shows absolute value of the current density vs. electrical bias of a two-band photodetector measured in a dewar with 180° field of view at temperatures 10 K, 30 K, 50K, 68 K, 77 K, 90 K. While the detector was in NIR mode, the p-i-n photodetector determined the current, while the detector was in LWIR mode the QWIP determined the current.

The I-V curves plotted in FIG. 13 were obtained at different detector temperatures without any optical bias, and with 0.12 W/cm$^2$ optical bias at 780 nm. With an applied optical bias, the device was in LWIR mode of operation where the QWIP was the current limiting sub-photodetector. A typical AlGaAs/GaAs QWIP I-V curve was observed and showed current saturation under voltage bias from −1 to −3 V. Open circuit voltage of the p-i-n sub-photodetector under optical bias shifted the zero crossing of the I-V curve by 1.4 V to positive bias region. As the temperature reached 90 K, the dark current of the QWIP sub-photodetector increased so that the p-i-n subphotodetector under optical bias became the current limiting device. Without optical bias, the photodetector was in NIR mode of operation and typical NIR p-i-n photodiode characteristics was observed in reverse bias with leakage current on the order of $10^{-6}$ A/cm$^2$. In forward bias, the p-i-n sub-photodetector turned on at 1.4 V, and then the QWIP sub-photodetector became the current limiting device. Under higher bias voltages, the current density with optical bias followed the current density without optical bias within a band of less than 10% increase. This increase in QWIP current was due to heating of the pixel with the bias laser light.

Figure 14:
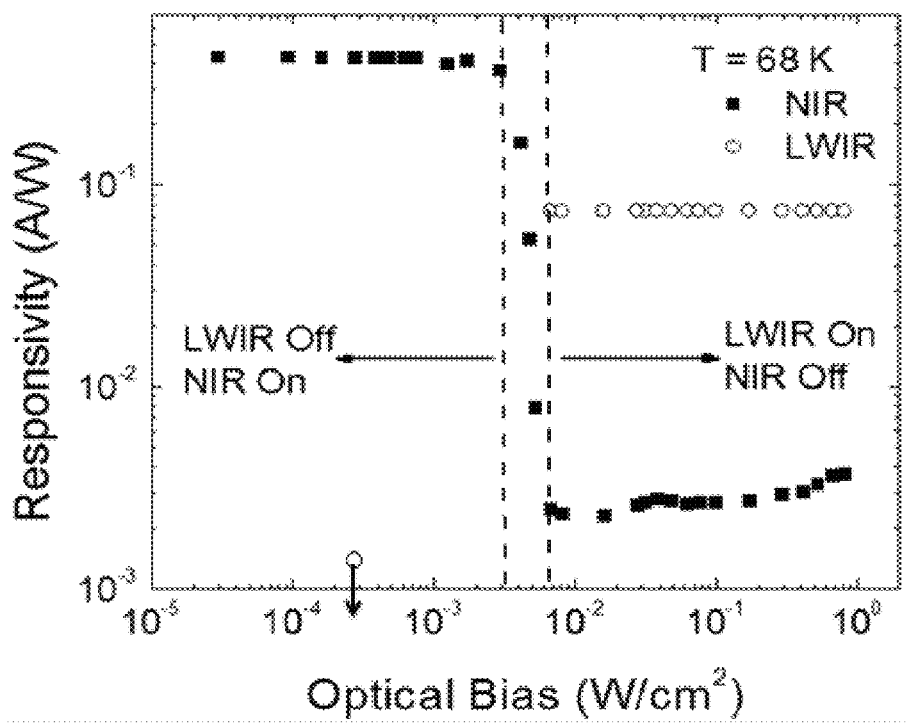
FIG. 14 shows peak responsivity vs. applied optical bias of the two-band photodetector at 68 K. Band switching between NIR and LWIR occurs at 3-6 mW/cm2 optical bias at 780 nm wavelength.

NIR responsivity was measured with a 780 nm LED. LWIR responsivity was measured under optical bias from a 780 nm laser diode and a chopped blackbody source with an IR filter. The output photocurrent signal was amplified with a current pre-amplifier connected to a lock-in amplifier. While the photodetector was kept at constant bias of −1 V (mesa top negative), NIR and LWIR responsivity was measured under different optical bias levels (FIG. 14). The NIR/LWIR band switching threshold occured at optical bias power interval of 1-10 mW/cm$^2$ at 68 K. As the operating temperature increased, the increased QWIP dark current required a higher optical bias threshold to switch bands. FIG. 14 shows that LWIR peak responsivity was 75 mA/W and remained constant for optical bias down to 6 mW/cm$^2$. The LWIR signal was too weak to be measured at an optical bias below 6 mW/cm$^2$. The result showed that the LWIR band can be switched off effectively by decreasing the optical bias below the optical bias threshold. The measured peak responsivity corresponded to a LWIR quantum efficiency of 1%, in good agreement with the typical value for this front-illuminated normal incidence QWIPs without grating coupling. FIG. 14 shows that NIR peak responsivity at the cut-off wavelength was constant at 0.43 A/W and the NIR photodetector was operational with QE of 65% under optical biases below 3 mW/cm$^2$. At optical biases higher than 6 mW/cm2, the device operated in the LWIR mode with a measured NIR responsivity of 2.7 mA/W.

Figure 15:
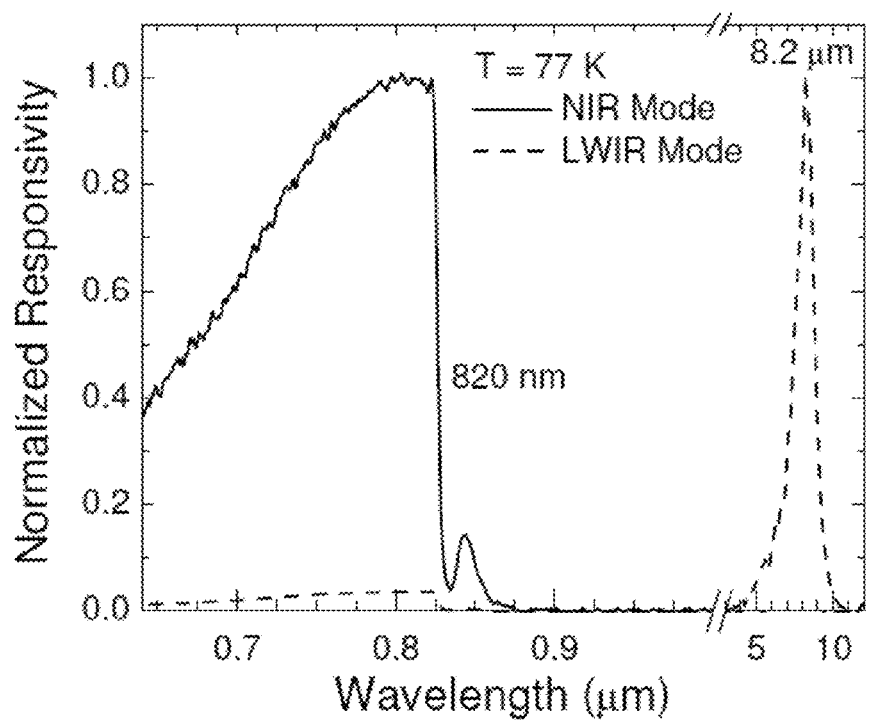
FIG. 15 shows spectral response of the two-band photodetector in NIR and LWIR modes of operation at 77K measured with different beam splitters in FTIR.

Spectral response of the photodetector was measured with an FTIR system equipped with KBr and quartz beam splitters, which were installed separately for the measurements in LWIR and NIR bands, respectively. Calibrated Si and MCT detectors were used with a halogen lamp as visible and a globar as infrared light sources. Under 1 W/cm$^2$ 780 nm optical bias and at 77 K, the LWIR spectrum was measured and the peak wavelength of the QWIP was 8.2 µm with an FWHM of 1.4 µm (FIG. 15). NIR spectrum was measured without optical bias and the cut-off wavelength was at 820 nm. Visible response of the photodetector was strongly attenuated due to the thick AlGaAs window layer.

Figure 16:
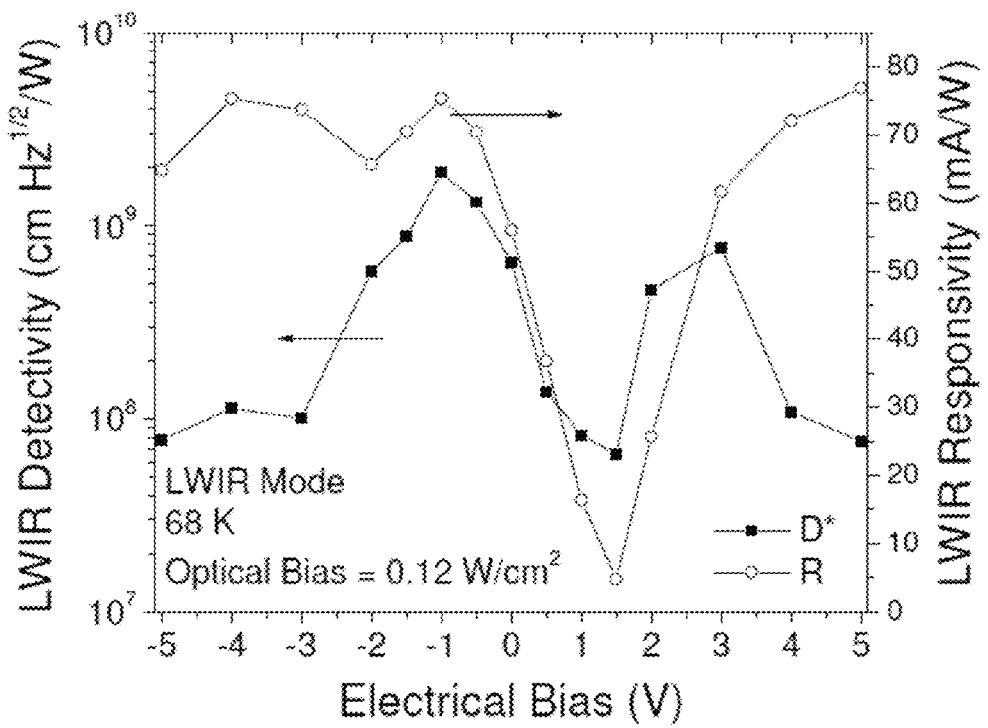
FIG. 16 shows detectivity and responsivity vs. applied bias in the LWIR band at 780 nm optical bias of 0.12 W/cm².

Peak specific detectivity (D*) of the detector in LWIR mode was measured to be 2×10$^9$ cm Hz$^{1/2}$/W under 290 K background and 180° field of view, at an optical bias of 0.12 W/cm$^2$ and an electrical bias of −1 V. The detectivity improves with grating coupling, the same QWIP design with back-side illumination and top-side etched grating coupling is suitable for FPA imaging with long integration times. FIG. 16 shows the peak responsivity and D* vs. bias voltage for the LWIR mode of operation. Measurements of the LWIR D* under different electrical biases show that the peak D* decreased as the electrical bias increased due to an increase in QWIP dark current. LWIR responsivity has a negative differential slope on −1 V to −2 V electrical bias range, consistent with early reports and related with intervalley transfer of electrons. The result shows that the p-i-n sub-photodetector doid not affect the transport characteristics of the QWIP under the reported operating conditions and the LWIR QWIP signal was as high as its single band counterparts. In NIR mode, photodetector noise was limited by the system noise, which was above the shot noise limit due to low current density, on the order of 10$^{-6}$ A/cm$^2$ at 68 K.

Figure 9:
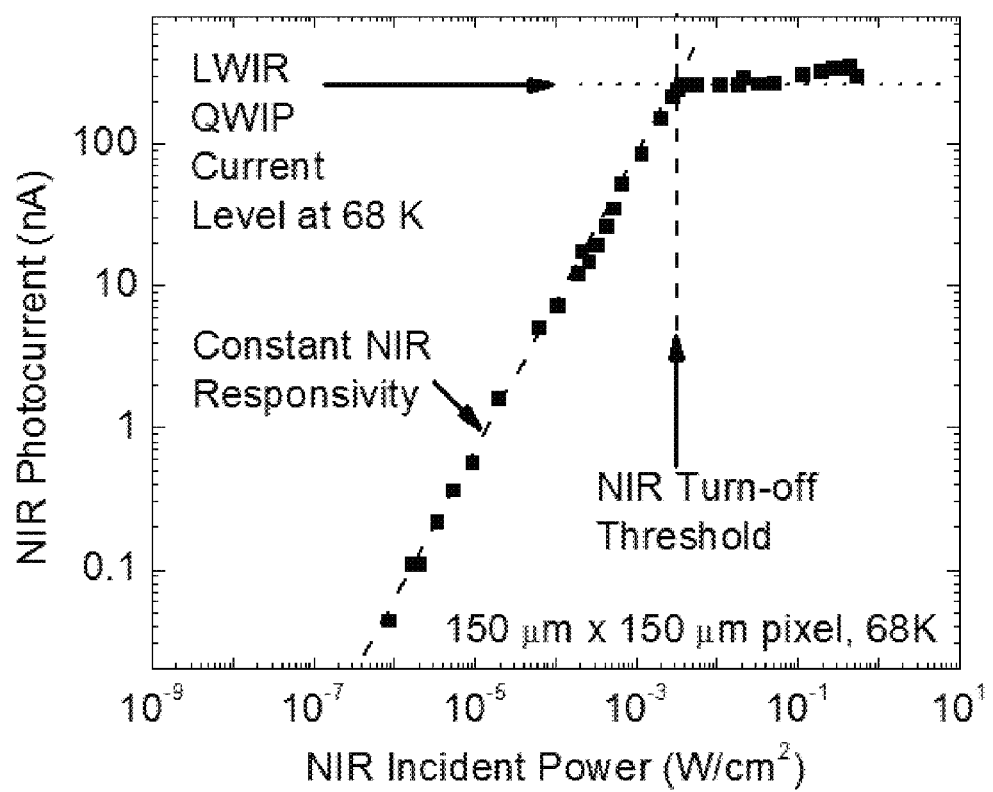
FIG. 9 shows the measured large-signal NIR peak photocurrent vs. incident peak power at 68 K of a 150 μm×150 μm sized square pixel when D1 is a NIR photodetector and D2 is an LWIR photodetector. The NIR responsivity is constant until the NIR sub-photodetector turn-off threshold of 3 mW/cm². Above the threshold, the photodetector enters the LWIR mode of operation and the LWIR QWIP sub-photodetector current limits the photodetector current.

Large-signal NIR peak photocurrent vs. the incident NIR peak power was measured using a 780 nm laser diode with 50% duty cycle at 150 Hz (FIG. 9) at 68 K. The NIR photocurrent was measured with a lock-in amplifier and observed to linearly increase over three orders of magnitude until the band-switching threshold of ~3-6 mW/cm$^2$, above which the NIR photocurrent signal saturates and stays constant. Above the threshold, the photodetector enters the LWIR mode of operation and the photocurrent was determined by the LWIR flux. Large-signal characteristics were measured with a single 780 nm laser diode at 100% modulation factor and 50% duty cycle. Small-signal characteristics were also measured with small NIR modulated light from a 780 nm LED, on top of the CW optical bias from a 780 nm laser diode. Both the large-signal and small-signal characteristics were consistent, which shows the linearity in the NIR mode of operation on a wide range of NIR flux. Therefore, The NIR mode maximum photocurrent was limited by the LWIR background current above band switching threshold of 3 mW/cm$^2$ optical bias at 68 K. When the temperature was increased to 77 K, the bandswitching threshold increases to 100 mW/cm$^2$ due to increased QWIP dark current.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to claims associated with these embodiments, along with the full scope of equivalents to which such claims are entitled.

We claim:

1. A photodetector module comprising,
   (i) one or an array of multi-band photodetector units (MB-PDs), wherein each individual MBPD comprises at least two building blocks, wherein
      (a) one building block is a first building block having a first photodetection band; and
      (b) a second building block is an ultimate building block, having a second photodetection band, positioned over or under the first building block;
      wherein the building blocks are serially connected, and the first and second photodetection bands are not identical; and
      wherein the first building block or ultimate building block comprises a detecting surface; and
   (ii) one or more optically biasing light sources;
   wherein each light source is positioned to illuminate the detecting surface of the MBPDs.

2. The photodetector module of claim 1, where each building block is a unipolar or bipolar type semiconductor device.

3. The photodetector module of claim 1, wherein each individual MBPD comprises two contacts; wherein one contact is a discrete contact for each individual MBPD and the second contact is a common contact for the entire array.

4. The photodetector module of claim 1, wherein each individual MBPD further comprises a semiconducting substrate, wherein the first or ultimate building block is positioned over the semiconducting substrate.

5. The photodetector module of claim 4, wherein the semiconducting substrate comprises GaN, GaAs, GaSb, InAs, InSb, InP, ZnTe, or CdTe.

6. The photodetector module of claim 4, wherein the semiconducting substrate is a virtual substrate comprising either (i) a GaN, GaAs, InP, GaSb, ZnTe, CdTe, or ZnCdTe epitaxial layer grown on a Si or Ge substrate; or (ii) a InP, GaSb, ZnTe, CdTe, or ZnCdTe epitaxial layer grown on a GaAs substrate.

7. The photodetector module of claim 1, further comprising a shutter positioned to isolate the MBPDs from the light signal.

8. The photodetector module of claim 1, further comprising an optical modulator positioned to modulate the light signal.

9. The photodetector module of claim 1, wherein each building block independently comprises semiconducting alloy layers.

10. The photodetector module of claim 1, wherein each building block independently comprises an element semiconductor or a III-V, II-VI, IV-IV, or IV-VI alloy layer, and wherein the element semiconductor is Si or Ge.

11. The photodetector module of claim 10 wherein each building block comprises a p-n junction having at least two layers, wherein the layers are independently selected from an element semiconductor and a III-V, II-VI, IV-IV, or IV-VI alloy layer, wherein one layer is p-doped and the other layer is n-doped, and wherein the element semiconductor is Si or Ge.

12. The photodetector module of claim 10, wherein each III-V layer independently comprises Si, Ge, AN, GaN, InN, InGaN, GaAlN, GaAlInN, GaAs, GaSb, AlGaAs, InAsSb, GaInSb, GaInAsSb, or AlGaAsSb.

13. The photodetector module of claim 1, wherein the bandgap of each of the building blocks is between about 0.012 and about 6.2 eV.

14. The photodetector module of claim 1, where a building block can be two-band photodetector switchable with voltage polarity change or with voltage magnitude change.

15. The photodetector module of claim 1, where at least one building block is a unipolar semiconductor device without one or more tunnel junctions.

16. A photodetector module comprising,
  (i) one or an array of multi-band photodetector units (MBPDs), wherein each individual MBPD comprises at least two building blocks, wherein
    (a) one building block is a first building block having a first photodetection band; and
    (b) a second building block is an ultimate building block, having a second photodetection band, positioned over or under the first building block;
    wherein the building blocks are serially connected, and the first and second photodetection bands are not identical;
    wherein the first building block or ultimate building block comprises a detecting surface; and
    wherein the first building block is a unipolar device and the second building block is a bipolar device; and
  (ii) one or more optically biasing light sources;
  wherein each light source is positioned to illuminate the detecting surface of the MBPDs.

17. The photodetector module of claim 16, wherein each individual MBPD comprises two contacts; wherein one contact is a discrete contact for each individual MBPD and the second contact is a common contact for the entire array.

18. The photodetector module of claim 16, wherein each individual MBPD further comprises a semiconducting substrate, wherein the first or ultimate building block is positioned over the semiconducting substrate.

19. The photodetector module of claim 16, wherein the semiconducting substrate comprises GaN, GaAs, GaSb, InAs, InSb, InP, ZnTe, or CdTe.

* * * * *